United States Patent [19]

Li

[11] 4,297,717
[45] Oct. 27, 1981

[54] SEMICONDUCTOR DEVICE

[76] Inventor: Chou H. Li, 379 Elm Dr., Roslyn, N.Y. 11576

[21] Appl. No.: 69,298

[22] Filed: Aug. 24, 1979

Related U.S. Application Data

[63] Continuation-in-part of Ser. No. 7,584, Jan. 29, 1979, which is a continuation-in-part of Ser. No. 764,433, Jan. 31, 1977, Pat. No. 4,136,435, which is a continuation-in-part of Ser. No. 405,138, Oct. 10, 1973, abandoned, which is a continuation of Ser. No. 190,483, Oct. 19, 1971, Pat. No. 3,765,956, Ser. No. 386,102, Aug. 6, 1973, and Ser. No. 802,018, Feb. 25, 1969, Pat. No. 3,500,135, which is a continuation-in-part of Ser. No. 490,955, Sep. 28, 1965, Pat. No. 3,430,109, said Ser. No. 190,483, is a continuation-in-part of Ser. No. 868,129, Oct. 21, 1969, abandoned, which is a continuation-in-part of Ser. No. 491,718, Sep. 30, 1965, abandoned.

[51] Int. Cl.³ ............................................. H01L 29/64
[52] U.S. Cl. ............................................. 357/15; 357/7
[58] Field of Search .......... 136/89 MS, 89 SJ, 89 TF; 29/572; 357/7, 15

[56] References Cited

U.S. PATENT DOCUMENTS 3,015,762  1/1962  Shockley .......................... 357/20

Primary Examiner—Aaron Weisstuch
Attorney, Agent, or Firm—Cooper, Dunham, Clark, Griffin & Moran

[57] ABSTRACT

A method of making hybrid solar cell comprising eutectically forming a vertical multi-junction solar cell having vertical photovoltaic junctions in the form of Schottky barriers and/or PN junctions and comprising a plurality of vertically elongated bodies of a first semiconductor material and a plurality of similarly elongated metal bodies which contact the semiconductor material bodies and space them from each other. All the bodies terminate at a common termination surface. The method also includes providing a horizontal solar cell comprising a layer of a second semiconductor layer deposited on the common, horizontal termination surface. The horizontal semiconductor layer has photovoltaic junctions either located at the common termination surface, or separating it into two horizontal sublayers, or both. The vertical and horizontal solar cells are so electrically interconnected that the output voltage of the hybrid cell is the sum of the output voltages of the two cells making it up. The material of the horizontal layer has a band gap different from that of the vertical semiconductor material bodies, and the solar cell with the wider band gap semiconductor material faces the sun. Structures of hybrid solar cells are also disclosed.

17 Claims, 5 Drawing Figures

SEMICONDUCTOR DEVICE

CROSS-REFERENCE TO RELATED APPLICATIONS

This is a continuation-in-part of my pending U.S. application Ser. No. 7,584, filed Jan. 29, 1979, which in turn was a continuation of my earlier U.S. application Ser. No. 764,433, filed Jan. 31, 1977, now U.S. Pat. No. 4,136,435, which in turn was a continuation-in-part of U.S. application Ser. No. 405,138, filed Oct. 10, 1973, abandoned. Application Ser No. 405,138 in turn was a continuation of applications Ser. Nos. 190,483, 386,102, and 802,018, filed Oct. 19, 1971, Aug. 6, 1973, and Feb. 25, 1969, respectively. The first and last of these applications have been issued as U.S. Pat. Nos. 3,765,956 and 3,500,135, respectively. U.S. Pat. No. 3,500,135 in turn was a continuation-in-part of application Ser. No. 490,955, filed Sept. 28, 1965, now U.S. Pat. No. 3,430,109. Application Ser. No. 190,483 in turn was a continuation-in-part of application Ser. No. 868,129, filed Oct. 21, 1969, now abandoned, which, in turn, was continuation-in-part of application Ser. No. 491,718, filed Sept. 30, 1965, now abandoned.

I hereby incorporate by reference each and every one of the above-cited references.

BACKGROUND

Field

This invention relates to solar cells, and more particularly to hybrid solar cells made by the melt-grown VLSI process.

Solar cells of various designs have been made. But, invariably, they are unreliable under extreme environments, very costly but not efficient. Various techniques and cell structures have been tried, often at great expenses. But the results are still not entirely satisfying. In particular, while vertical multi-junction and heterojunction solar cells both look very promising as being efficient, their costs are still too high for general usages.

Accordingly, an object of the invention is to provide low-cost but efficient and improved solar cells;

A further object of this invention is to provide reliable, hybrid solar cells made efficiently and rapidly by a thin-film, melt-growth provess;

A broad object of this invention is to provide low-cost VLSI circuits having improved operating characteristics.

Another object is to obtain novel, dielectrically isolated VLSI solar cells or circuits;

Yet another object is to obtain low-cost, VLSI solar cells or circuits made by simple, rapid, and mass-production processes;

SUMMARY

To these ends, the present invention method for making, and structure of, hybrid solar cells comprising the combination of eutectic, vertical multi-junction solar cell and a horizontal solar cells into a physically and optically integral device. The material of the horizontal solar cell has an (electronic energy) band gap which is different from that of the semiconductor material in the vertical solar cell, with the wider band gap semiconductor material always facing the sun. The two cells are selectively interconnected at their joining interface so that the output voltage of the hybrid cell is the sum of the output voltages of the two cells making it up.

BRIEF DESCRIPTION

The invention and its further objects and features will be more clearly understood from the following detailed description taken in conjunction with the drawing in which.

DETAILED DESCRIPTION

It will be understood that the specific embodiments described are merely illustrative of the general principles of the invention and that various modifications are feasible without departing from the spirit and scope of the invention. That is, the invention is generally applicable to different types of melt-growth processes including normal freezing, zone melting, and melt flow process. More particularly, it will be evident that the invention may be employed to form VLSI devices other than solar cells and circuits, but to other types of electrooptical or other devices; and that semiconductor materials and metals other than those described may be used to practice the invention.

Both pending applications Ser. Nos. 764,433 and 580,414 describe in FIG. 1 the differential segregation behavior of p-type (e.g., Al) and n-type (e.g., Sb) dopants in a semiconductor such as Ge. Such behavior occurs because the segregation coefficient for the p-type dopant, $k_p$, is generally much larger than that for the n-type dopant, $k_n$. By properly selecting the initial concentrations for the p-type and n-type dopants, $c_p$ and $c_n$, respectively, the first portion to freeze will have higher p-type dopant concentration, $c_p$, than n-type dopant concentration, $c_n$. Yet the last portion to freeze may have higher n-type dopant concentration than p-type dopant concentration. Where the two concentrations $c_p$ and $c_n$ cross, a pn junction is formed. This differential segregation behavior is shown by the two concentration profiles, or concentration vs distance solified $p_s$ as shown in FIG. 1

Figure 1:
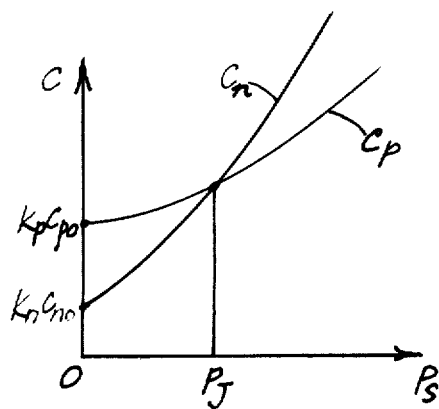
FIG. 1 shows the differential segregation behavior of n-type and p-type dopants in a semiconductor upon freezing the melt.

The segregation behavior shown in FIG. 1 is universal in all melt growth processes. In cellular growth as shown in FIG. 10 of both pending applications and also in FIG. 2 of this application, the cells nucleate at positions B and C, and grow along the temperature gradient in the vertical direction. The solid-liquid interface is not planar, like PCBQ, but paraboloidal as shown by the two curves. The concentration of dopants at B and C, i.e., the beginning of solidification for the plane PCBQ, are thus $c_{po}$ and $c_{no}$ as shown in FIG. 1. Hence, by proper compositioning the initial dopant concentrations, the presence and location of the pn junction at $p_j$ can be calculated. In addition, selecting suitable dopant pairs with segregation coefficients $k_p$ and $k_n$ allow the dopant concentration profiles at the junction location and, hence, the junction characteristics, to be determined.

Figure 2:
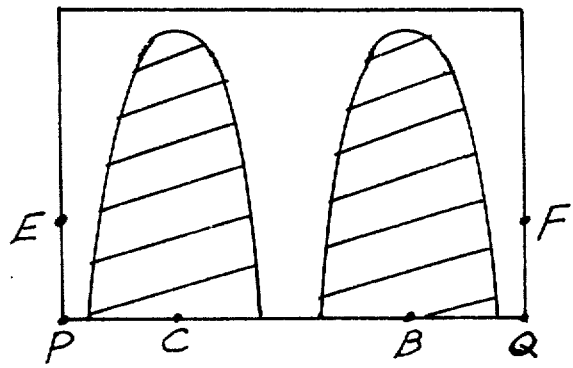
FIG. 2 shows a longitudinal end view of some melt-grown cells, from which cellular VLSI circuits may be made.

In eutectic growth, the situation is slightly more complicated, because the elongated microscopic eutectic phase bodies do not have similar or identical shape, composition, size, . . . as in cellular growth in FIG. 2, even though every other one has.

I have electron-beam melt and solidified, in vacuum, eutectic Si-Ti, Si-Al, Si-Ni, Si-Cu, Si-Fe, and Si-Mn samples; and directionally grown eutectic Si-Al samples. All these samples showed eutectic solution rods typically two to three microns in sizes and spacings. Shottky barriers should be present between the silicon rods and the surrounding metal matrix. Thermal microprobing indicated high doping levels switching from p-type to n-type within micron distances. Oscilloscope studies confirmed the presence of pn junctions in the microscopic (i.e., ½ to 15 microns) silicon rods and, more importantly, good diode characteristics. In addition, the diode characteristics are reproducible from rod to rod. These results confirm the validity and feasibility of low-cost but reliable VLSI microcircuits from, e.g., eutectic Si-Ti melts containing Al and Sb dopants in amounts according to FIG. 1.

The pn junction, eutectic material is already useful for making the following VLSI microcircuits: (1) solar cells; (2) rectifiers for high temperature operation; (3) high current rectification in small volume; and (4) device applications which rely on one contact to the matrix and on a scanning beam for addressing or reading the individual diodes.

Figure 3:
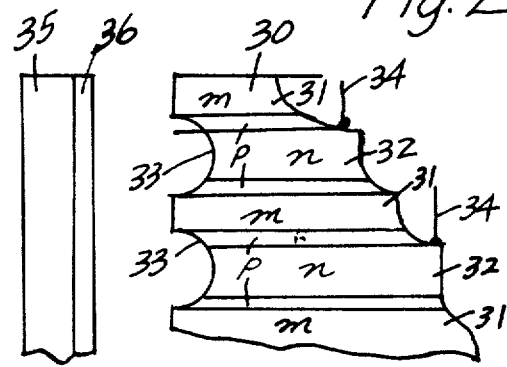
FIG. 3 shows the principle and technique of differential or tangential expansion of thin layers to provide area for contacting.

To produce VLSI microcircuits where individual diodes have to be "wire" contacted, standard masks and layouts cannot be used because of the somewhat irregular spatial arrangements of the diodes. However, the following schemes are possible:

1. For sheet-type eutectic microcircuits, selectively removing material by laser or other techniques to differentially or tengentially expand across the thickness of the semiconductor layers 32 in FIG. 3, according to the principles of my U.S. Pat. No. 3,430,109. The micron-thin semiconductor layers 32 can then be expanded even several hundred times to provide enough areas to contact with wires 34, without shorting out the neighboring metal layers 31 or semiconductor layers 32. The resulting structure is a "stair-case" connection pattern having a cross-section as shown in FIG. 3.

2. For rod-type eutectic microcircuits, distinction must be made between circuit components in two directions, e.g., x and y, instead of only in the x-direction as is the case with the sheet-type eutectic microcircuits. The differential expansion principles of U.S. Pat. No. 3,430,109, however, can still be used to provide, in addition to a set of steps in the x-direction, another set of steps in the y-direction, (not shown but pointing outwardly of the drawing paper) so that any component in the (x,y) coordinates can be individually contacted by a wire bond. The resulting structure is a "pagoda" connection pattern having a cross-section in both x and y-directions also representable by FIG. 3.

3. Using the differentially expanded wafer 30 as a master wafer to produce an LED array according to my pending applications. This array provides a multiple light source to expose an adjacent, uniform photoresist layer coated on an adjacent wafer sliced from the same eutectic junction crystal. This technique is used in conjunction with multi-level metallizing and micron-precision phtolithography now already available.

4. A more universally applicable but expensive method is to employ a system combining: pattern recognition devices, computer, and light generator. The pattern recognition devices may comprise an optical sensing head which senses and differentiates the metal, oxide, and semiconductor regions based on surface color, luster, or reflectivity. An electromagnetic sensdevice is also possible. The sensed signals are fed into a computer which calculates the location (x,y), shape, size, . . . of each individual sheet or rod of semiconductor or metal. The wafer is then coated with a photoresist layer, and the computer then directs an electron or laser beam to expose selected regions on the wafer for the required contact pattern.

The above four schemes are for use in making eutectic microcircuits from junction eutectic crystals grown according to the teaching of this specification, and those of my two pending applications. Similar techniques can also be used to make cellular microcircuits from cellular junction crystals grown according to the same specifications. After melt growth, the eutectic or cellular crystals must be sliced, polished, examined, and selected before making the contacts.

Figure 4:
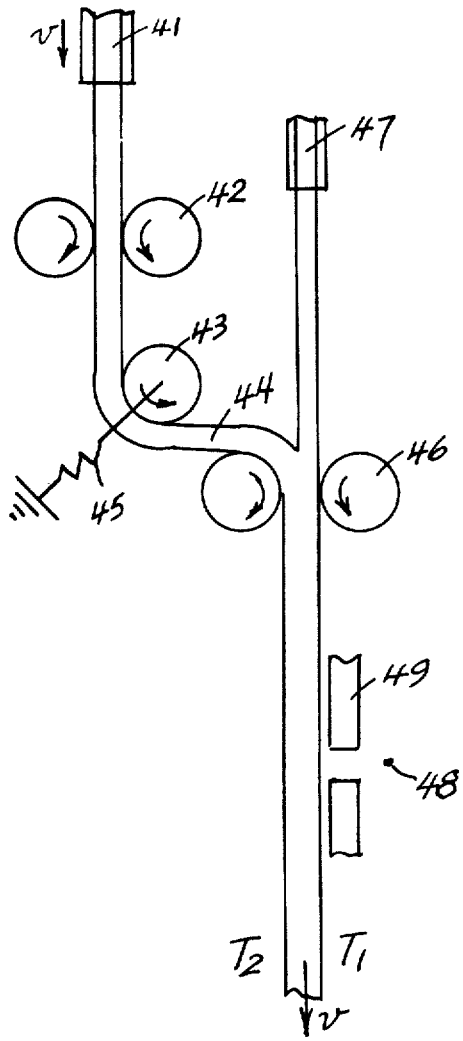
FIG. 4 shows a continuous, rapid process for producing solid state devices on sheet-type substrates by splat-cooling process.

FIG. 4 shows a system for rapidly manufacturing complete VLSI microcircuits. Here, a substrate material, e.g., conductive aluminum or iron, comes in a molten stream from nozzle 41 onto a chilled rotating roll or rolls 42, according to the description of, e.g., U.S. Pat. Nos. 905,758 by Strange and Pim, and 3,297,436 by Duwez. The linear speed of the rolls 42 should be the same as the nozzle velocity to prevent tear or buckling of splat-formed substrate ribbon. After passing through the resilient roller 43, the aluminum substrate enters into another set of splat-cooling rolls 46. At the same time, a stream of solid-state device material comes from nozzle 47, also into the rolls 46. Again, the nozzle velocity for the device material must be the same as the linear velocity of the rollers 46.

The temperature of the substrate sheet 44, and the temperature and jet velocity of the device material must be so controlled that there is enough interdiffusion between the device material and the substrate sheet to establish adherence and required electrical properties, but not enough to cause contamination of the device material by the substrate in great quantities. With 40-cm rolls 46 rotating at 4200 rpm, the linear velocity is 8800 cm/sec. For a 1-cm contact length, the contact duration is 0.114 ms. The diffusion length, or roughly the metal-semiconductor interfacial region thickness, is thus about 0.48 microns if solid diffusion is neglected and liquid diffusion proceeds at the rate of $2 \times 10^{-5}$ cm$^2$/sec.

It is evident that three or more layered structures may be obtained by providing one or more additional nozzles or jets and chilled rolls. Also, the substrate need not be made in this system, but may be fed as a thin solid sheet stock, in which case the nozzle 41 and rolls 42 are dispensed with.

Most semiconductors are brittle and expand on freezing, causing breakage. However, with the soft and yieldable aluminum substrate as a cushion at least on one side, such breakage may be reduced or eliminated to the point of useful devices being obtainable, particularly if the device material is relatively thin, e.g, of the order of less than ten microns in thickness.

The splat cooled material has extremely fine grains, possibly less than 50 Å in cluster forms, and have very interesting electrical and magnetic properties. The combined sheet is then passed through a deposition region 48 which is periodically turned on and off, and together with a mask 49, deposits a pattern of such materials as Sn, In, Ga, . . . . Next, the sheet enters a temperature zone with the temperature $T_2$ greater than $T_1$ (on the left). Temperature gradient zone melting (Pfann (*Zone Melting*, Wiley, New York, 1958) then operates and the deposited metal migrates up toward the higher-temperature left side while simultaneously: (1) producing single crystal regions; (2) doping the device material if the metal is a dopant; and (3) forming eutectic phase bodies of, e.g., Si-Sn in the zone melted regions. The resulting structure can be used, e.g., as a low-cost solar cell array.

Magnetic films (e.g., of 80 a/o Ni-20 a/o Fe or $Fe_{40}Ni_{40}P_{14}B_6$) may be used in combination with the device material such as Si, GaAs, InSb, or Ge. Splat cooled magnetic films, in particular, have entirely different magnetic properties relative to the zone-refined regions, so that VLSI magnetic memory circuits may be formed. It is even possible to splat-cool a magnetic film on one major surface of the substrate while splat-cool a semiconductor film on the same or other major surface. The circuit components in the semiconductor film may be in alignment with components in the magnetic film so that the semiconductor components and magnetic components interact according to a desired manner.

The resultant microcircuits should be highly stable and reliable because of:

1. Thermodynamic equilibrium even at the crystal growth temperature, the highest temperature the microcircuits will ever see;

2. Low-temperature stability because of negligible solid diffusion;

3. High stability at elevated temperatures or under thermal cycling conditions;

4. Long lives even with minimum thermal cooling;

5. Minimal dopant outdiffusion or redistribution due to thermodynamic equilbrium;

6. Graded concentrations and contact stability due to thermodynamic equilibrium;

7. Extreme radiation resistance due to small component sizes, strong drift field due to great concentration gradients, general chemical and thermomechanical stability, relatively defect-free semiconductor material, and fewer radiation-defect interactions; and 8. Minimal defect generation during processing, handling, and operation because the surrounding metal matrix protects and strengthens the semiconductor material.

Figure 5:
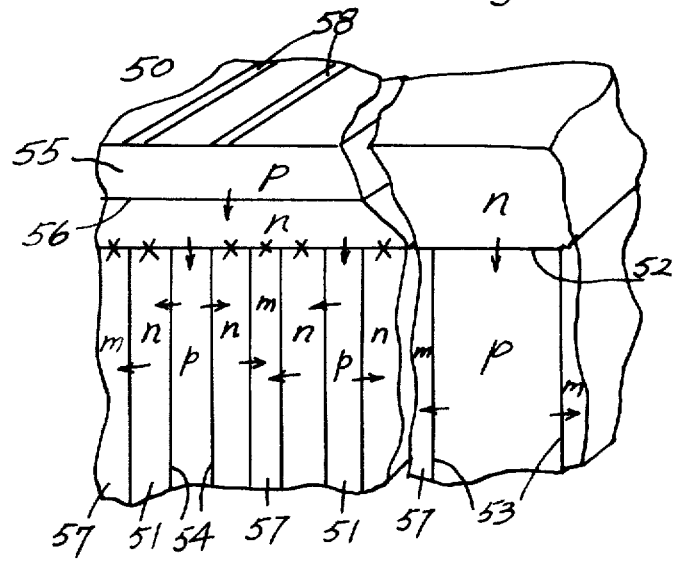
FIG. 5 is a perspective of the hybrid solar cell.

FIG. 5 shows the hybrid solar cell 50 of the invention. The cell structure has a melt-grown eutectic mass having a plurality of vertically elongated bodies 51 of a first semiconductor material, such as silicon or gallium arsenide obtained in thin-film form on the equipment of FIG. 4. These bodies are spaced apart from each other by a plurality of similarly elongated metal (such as nickel, manganese, chromium, magnesium, aluminum iron for silicon or zinc for gallium arsenide) bodies 57. All these bodies terminate at a common, horizontal surface and thus form a vertical multi-junction solar cell having vertically extending photovoltaic junctions in the form of Schottky barriers 53 between the metal and semiconductor bodies (See right side of FIG. 5), or of PN junctions 54 inside the semiconductor bodies 51 and separating the individual elongated bodies of semiconductor material into regions of different conductivities, i.e., p-type and n-type conductivities (See left side of FIG. 5), or both. The formation of these PN junctions has been fully described in my related applications and issued patents, on which this application depends. In particular, whether the core portions of the vertical semiconductor bodies 51 are n-type or p-type depends on whether the n-type dopants have larger or smaller, respectively, melt segregation coefficients than the p-type dopants. These coefficients can be obtained from a handbook on semiconductor materials or semiconductor device technology.

A variety of semiconductor materials may be employed. These include: in the order of decreasing electronic energy band gap: CdS (2.35 ev), GaP (2.24 ev), Se (2.2 ev), AlAs (2.16 ev), ZnTe (2.1 ev), CdTe (1.5 ev), AlSb (1.49 ev), GaAs (1.35 ev), InP (1.27 ev), Si (1.11 ev), Ge (0.7 ev), and GaSb (0.68 ev).

A generally horizontal layer of a second semiconductor material, possibly selected from the same list given above (e.g., Si on Ge, GaAs on Si, CdS on CdTe, GaP on InP, AlAs on GaAs, ZnTe on CdTe), is deposited on top of, or underneath, the eutectic mass, if the material of this layer is, respectively, of a wider or narrower bandgap than the first semiconductor material. This horizontal layer 55, of a given conductivity type, may form a horizontally extending photovoltaic PN junction located at the interface 52 between this layer and the eutectic, vertically elongated semiconductor bodies 51 (See right side of FIG. 5). Alternately or in addition, this layer has an internal, horizontally extending photovoltaic PN junction 56. Thus, a hybrid solar cell having both a horizontal solar cell and a vertical solar cell is formed.

The solar cell on the top surface facing the sun, whether vertical or horizontal, must have a wider band gap so as to collect the higher energy solar photons while the lower energy solar photons go into the solar cell having the narrower band gap material to be collected therein, since the wider band gap material is at least partly transparent to solar radiation.

Either of or both the first and second semiconductor materials may be single-crystalline or polycrystalline. One of the first and second semiconductor materials may be a dopant relative to the other and said other material (e.g., GaAs) is doped by the one semiconductor material (e.g., Si for GaAs) into a doped region separated from the remainder thereof by a PN photovoltaic junction. The metal bodies 57 in the eutectic mass may be doping relative to either or both semiconductor materials (e.g., Ti for GaAs but not for Si for which it is non-doping). The two semiconductor materials may share a common element, e.g., InSb-GaSb, InSb-AlSb, InSb-InAs, GaSb-AlSb, GaSb-GaAs, InAs-GaAs, InAs-InP, GaAs-GaP. The components of one semiconductor material may be dopants relative to the other semiconductor material (e.g., GaAs to Si).

The horizontal layer often should be deposited on top of the eutectic mass, because the metal bodies 57 in the mass are fairly opaque to solar radiation. On the other hand, these metal bodies can be very narrow and can, furthermore, serve as a built-in top collection grid if the horizontal layer is deposited underneath the eutectic mass. In any case, of course, the top solar cell must have a wider band gap semiconductor material and be less than five microns thick in the vertical direction while the lower solar cell is up to 100 microns thick in the same vertical direction. The width in the horizontal direction of the semiconductor material bodies 51 should be less than about 10 microns while the volume ratio of these material bodies to the metal bodies 57 in the eutectic mass should be greater than four to one.

The electrical interconnection between the vertical and horizontal solar cells are critical. These solar cells generally produce different output voltages when exposed to the same solar radiation. Hence, they cannot be connected in parallel and must be connected in series. In this way, the output voltage of the hybrid solar cell is the sum of the output voltages of the two cells, which is often very desirable. This requires that only selected portions of the vertical solar cell are electrically connected to the horizontal cell at the contacting interface 52. Specifically and as an example, the n-type region in the horizontal layer 55 of the horizontal solar cell on the left side of FIG. 5 is electrically connected only to the p-type portions in the vertical semiconductor bodies 51, but are electrically insulated (shown by crosses in FIG. 5) from both the metal bodies 57 and the n-type portions of the same vertical semiconductor material bodies 51. Similar reasoning applies where there are Schottky barriers at the metal-semiconductor interfaces such as are indicated as 53. It is then possible to obtain, as shown in FIG. 5, a combined output voltage which is the sum of two or more of the output voltages from the following possible photovoltaic junctions (See arrows showing individual voltages or currents): (1) horizontal PN junction in layer 55; (2) hetero junction at interface 52; (3) vertical multiple PN junctions; and Schottky barriers between the vertical metal and semiconductor bodies.

Conventional semiconductor technology has been fully developed to prepare, by deposition, plating, etching, oxidizing, diffusion, . . . , selected areas of specific metal or semiconductor bodies for electrical insulation, ohmic contacting, Schottky barrier formation, and/or heterojunction formation. See handbooks on semiconductor technology as well as my referenced U.S. patents and applications. In the finished hybrid solar cell, the two external contact terminals to tap the combined output voltage thus comprise a top collection grid pattern 58 on the surface of the horizontal layer 55 and the metal bodies 57 inside the eutectic mass of the horizontal solar cell. To contact the metal bodies 57 in the eutectic mass, see by referenced U.S. patents.

The invention is not to be construed as limited to the particular forms disclosed herein, since these are to be regarded as illustrative rather than restrictive.

What is claimed is:

1. An active solid state structure comprising:
   a metal substrate sheet and a layer of solid material adhered to the metal substrate sheet;
   said solid material comprising a multiplicity of elongated bodies of a single crystal semiconductor device material spaced from each other by similarly elongated bodies of a metal, there being electronic barriers between said elongated bodies of the semiconductor material and elongated bodies of metal; and
   said elongated bodies of semiconductor material and of a metal and said electronic barriers therebetween being formed concurrently with each other as an integral structure by a temperature gradient process.

2. A solid state structure as in claim 1 in which said bodies and electronic barriers therebetween are formed by a temperature gradient applied across the thickness of the layer of said solid material.

3. A solid state structure as in claim 2 in which the hotter side of the temperature gradient is at the side of the solid material layer adhering to the metal substrate sheet.

4. A solid state structure as in claim 1 in which the elongated bodies and barriers therebetween are formed by a temperature gradient zone melting process.

5. A solid state structure as in claim 1 in which the layer of solid material is formed by splat cooling.

6. A solid state structure as in claim 1 in which the metal forming the elongated bodies is a dopant relative to the semiconductor material.

7. A solid state structure as in claim 1 in which the metal forming the elongated bodies is not a dopant relative to the semiconductor material.

8. A solid state structure as in claim 1 in which the semiconductor material is selected from the group consisting of silicon and gallium arsenide.

9. A solid state structure as in claim 1 in which said elongated bodies of the metal and of the semiconductor material are eutectic phase bodies.

10. A solid state structure as in claim 1 in which the layer of solid material is less than 10 microns thick.

11. A solid state structure as in claim 1 in which the metal substrate sheet comprises a metal selected from the group consisting of aluminum and iron.

12. A solid state structure as in claim 1 in which the elongated bodies of semiconductor material have dimensions of less than 15 microns in a selected direction.

13. A solid state structure as in claim 1 in which the thickness of the metal semiconductor interfacial region where the solid material adheres to the metal substrate sheet, is less than half a micron.

14. A solid state structure as in claim 1 in which the electronic barriers between the elongated bodies of the semiconductor material and the metal are rectifying barriers.

15. A solid state structure as in claim 14 in which the barriers are Schottky barriers.

16. A solid state structure as in claim 1 in which the elongated bodies of metal comprise metal selected from the group consisting of nickel, manganese, chromium, magnesium, aluminum, iron and zinc.

17. A solid state structure as in claim 1 in which the solid material is formed into solid form by splat cooling and said elongated bodies of semiconductor material are less than 50 A° in a direction transverse to the temperature gradient.

* * * * *